United States Patent
Hayes

(10) Patent No.: US 7,463,986 B2
(45) Date of Patent: *Dec. 9, 2008

(54) ELECTRICAL POWER METERING SYSTEM

(75) Inventor: Paul V Hayes, Union City, NJ (US)

(73) Assignee: Hudson Bay Wireless LLC, Union City, NJ (US)

(*) Notice: Subject to any disclaimer, the term of this patent is extended or adjusted under 35 U.S.C. 154(b) by 0 days.

This patent is subject to a terminal disclaimer.

(21) Appl. No.: 11/447,657

(22) Filed: Jun. 6, 2006

(65) Prior Publication Data

US 2006/0271314 A1    Nov. 30, 2006

Related U.S. Application Data

(63) Continuation-in-part of application No. 10/280,533, filed on Oct. 25, 2002, now Pat. No. 7,058,524.

(51) Int. Cl.
*G06F 19/00* (2006.01)
*G01R 21/00* (2006.01)
*G01R 21/06* (2006.01)

(52) U.S. Cl. .................................................. 702/62

(58) Field of Classification Search .................. 702/57, 702/60–62, 189–190; 340/870.01, 870.02, 340/870.03, 870.11; 375/220, 222, 295, 375/316; 709/217; 379/106.03, 114.28; 700/1, 73, 90, 286, 291

See application file for complete search history.

(56) References Cited

U.S. PATENT DOCUMENTS

| | | | |
|---|---|---|---|
| 3,842,348 A * | 10/1974 | Goshy | 324/94 |
| 4,565,995 A * | 1/1986 | Stokes et al. | 340/571 |
| 5,481,259 A | 1/1996 | Bane | 340/870.03 |
| 5,493,287 A | 2/1996 | Bane | 340/825.52 |
| 5,631,636 A | 5/1997 | Bane | 340/825.69 |
| 5,696,695 A * | 12/1997 | Ehlers et al. | 700/286 |
| 5,699,276 A * | 12/1997 | Roos | 379/106.03 |
| 5,726,646 A | 3/1998 | Bane et al. | 340/870.03 |
| 5,748,104 A | 5/1998 | Argyroudis et al. | 340/870.11 |
| 5,930,773 A | 7/1999 | Crooks et al. | 705/30 |

(Continued)

OTHER PUBLICATIONS

Clark, 'Powerline Communications: Finally Ready for Prime Time?', Feb. 1998, IEEE Publication, pp. 10-11.*

(Continued)

*Primary Examiner*—Edward Raymond
*Assistant Examiner*—Elias Desta
(74) *Attorney, Agent, or Firm*—McCarter & English, LLP

(57) ABSTRACT

A wireless electrical power metering system is provided. A processor having a multichannel power line transceiver, a wireless transceiver, and a power meter attached thereto measures power consumption information at a location. The processor converts the power consumption information into IP-based data, and transmits same over the wireless transceiver. The information can be wirelessly received by a remote monitoring station or transmitted across the Internet for storage, analysis, and billing. The processor can remotely control appliances in response to power consumption trends. The processor can relay information between a wired or wireless network and a power line network, to allow multiple dwellings to be networked using power lines, and households to be connected to the Internet via a power line network. The electrical power metering system also includes Global Positioning System (GPS), biometric scanning, emergency alert reception, and environmental monitoring capabilities.

48 Claims, 10 Drawing Sheets

U.S. PATENT DOCUMENTS

| | | | |
|---|---|---|---|
| 6,035,285 A | 3/2000 | Schlect et al. | 705/30 |
| 6,088,688 A | 7/2000 | Crooks et al. | 705/412 |
| 6,122,603 A | 9/2000 | Budike, Jr. | 702/182 |
| 6,128,290 A * | 10/2000 | Carvey | 370/347 |
| 6,133,850 A | 10/2000 | Moore | 340/870.02 |
| 6,150,955 A | 11/2000 | Tracy et al. | 340/870.02 |
| 6,195,018 B1 | 2/2001 | Ragle et al. | 340/870.01 |
| 6,246,677 B1 | 6/2001 | Nap et al. | 370/346 |
| 6,300,881 B1 | 10/2001 | Yee et al. | 340/870.02 |
| 6,311,105 B1 | 10/2001 | Budike, Jr. | 700/291 |
| 6,366,622 B1 * | 4/2002 | Brown et al. | 375/322 |
| 6,498,627 B1 | 12/2002 | Hershey et al. | |
| 6,528,986 B2 * | 3/2003 | Ballard | 324/158.1 |
| 6,792,337 B2 * | 9/2004 | Blackett et al. | 700/295 |
| 6,891,838 B1 * | 5/2005 | Petite et al. | 370/401 |
| 6,982,650 B1 * | 1/2006 | Asplund | 340/870.02 |
| 7,058,524 B2 | 6/2006 | Hayes et al. | 702/62 |
| 2001/0010490 A1 | 8/2001 | Bellin | 340/7.46 |
| 2002/0013858 A1 | 1/2002 | Anderson | 709/245 |
| 2002/0018545 A1 | 2/2002 | Crichlow | 379/106.03 |
| 2002/0024424 A1 | 2/2002 | Burns et al. | 340/310.01 |
| 2002/0038279 A1 | 3/2002 | Samuelson et al. | 705/37 |
| 2002/0045992 A1 | 4/2002 | Shincovich | 702/58 |
| 2002/0054619 A1 | 5/2002 | Haas | 375/133 |
| 2002/0169848 A1 * | 11/2002 | Esterman | 709/217 |
| 2003/0009401 A1 * | 1/2003 | Ellis | 705/35 |
| 2004/0083066 A1 | 4/2004 | Hayes et al. | |
| 2004/0193329 A1 | 9/2004 | Ransom et al. | |
| 2006/0071776 A1 | 4/2006 | White et al. | |

OTHER PUBLICATIONS

Young et al., 'Real-Time Intranet-Controlled Virtual Instrument Multiple-Circuit Power Monitoring', Jun. 2002, IEEE Publication, vol. 49, No. 3, pp. 579-584.*

Pittser, 'Computer Applications in Electrical Utility Industry', Apr. 2001, IEEE Publication, pp. 1-5.*

Thumaty et al.,'Development of Low-IF Receiver and a Fixed Wireless Utility Network', Mar. 2002, IEEE, pp. 935-938□□.*

Ando et al., 'Automatic Meter Reading System adopting automatic routing technology', Jan. 2002, IEEE, pp. 2305-2309.*

Anderson et al., 'Unique EHV Current Probe for Calibration and Monitoring', Jan. 2001, IEEE, pp. 379-384.*

Delsing et al., 'The IP-Meter, Design Concept and Example Implementation of an Internet Enabled Power Line Quality Meter'), IEEE Article, May 2000, pp. 657-660.*

Ando, et al., "Automatic Meter Reading System Adopting Automatic Routing Technology," Jan. 2002, IEEE, pp. 2305-2309.

Andersson, et al., "Unique EHV Current Probe for Calibration Monitoring," Jan. 2001, IEEE, pp. 379-384.

Delsing, et al., "The IP-Meter, Design Concept and Example Implementation of an Internet Enabled Power Line Quality Meter," May 2000, IEEE, pp. 657-660.

Circon 200-Series Products—Map diagram from Circon Website: http://www.circon.com/products/product-map.htm (1 page).

Lappin, "Country Road Warrior," Wired, Issue 3.08, Aug. 1995 (1 page).

"What Were the Key Project Milestones—How Has the Project Evolved Over Time?," printout from http://www.glasgow-ky.com/epb/faq01.htm#question7 (1 page).

Thumaty, et al., "Development of a Low-IF Receiver and a Fixed Wireless Utility Network," Mar. 2002, IEEE, pp. 935-938.

Office Action dated Mar. 2, 2004, from parent application U.S. Appl. No. 10/280,533 filed Oct. 25, 2002 now U.S. Patent No. 7,058,524 issued Jun. 6, 2006 (15 pages).

Response dated Sep. 1, 2004, from parent application U.S. Appl. No. 10/280,533 filed Oct. 25, 2002 now U.S. Patent No. 7,058,524 issued Jun. 6, 2006 (13 pages).

Office Action dated Dec. 2, 2004, from parent application U.S. Appl. No. 10/280,533 filed Oct. 25, 2002 now U.S. Patent No. 7,058,524 issued Jun. 6, 2006 (15 pages).

Response dated Mar. 2, 2005, from parent application U.S. Appl. No. 10/280,533 filed Oct. 25, 2002 now U.S. Patent No. 7,058,524 issued Jun. 6, 2006 (17 pages).

Supplemental Response dated Mar. 29, 2005, from parent application U.S. Appl. No. 10/280,533 filed Oct. 25, 2002 now U.S. Patent No. 7,058,524 issued Jun. 6, 2006 (12 pages).

Office Action dated May 18, 2005, from parent application U.S. Appl. No. 10/280,533 filed Oct. 25, 2002 now U.S. Patent No. 7,058,524 issued Jun. 6, 2006 (18 pages).

Preliminary Amendment dated Oct. 17, 2005, filed in connection with a Request for Continued Examination in parent application U.S. Appl. No. 10/280,533 filed Oct. 25, 2002 now U.S. Patent No. 7,058,524 issued Jun. 6, 2006 (19 pages).

Notice of Allowance dated Jan. 11, 2006, from parent application U.S. Appl. No. 10/280,533 filed Oct. 25, 2002 now U.S. Patent No. 7,058,524 issued Jun. 6, 2006 (8 pages).

International Search Report of the International Searching Authority mailed Jan. 28, 2008, issued in connection with International Patent Appl. No. PCT/US07/13400 (3 pages).

Written Opinion of the International Searching Authority mailed Jan. 28, 2008, issued in connection with International Patent Appl. No. PCT/US07/13400 (5 pages).

Valence Semiconductor, Inc., Product Preview, VS6801 HomePlug Analog Front End Power Line Interface, Dec. 2001 (2 pages).

Analog Devices, Inc., Active Energy Metering IC with Serial Interface ADE7756 (2001) (32 pages).

* cited by examiner

ELECTRICAL POWER METERING SYSTEM

RELATED APPLICATIONS

This application is a continuation-in-part of U.S. patent application Ser. No. 10/280,533 filed Oct. 25, 2002, now U.S. Pat. No. 7,058,524, the entire disclosure of which is expressly incorporated herein by reference.

BACKGROUND OF THE INVENTION

1. Field of the Invention

The present invention relates to power consumption measurement, and more specifically, to an electrical power metering system for measuring electrical power consumption, converting the measurements to IP format, and delivering the information in one or more wired or wireless networks.

2. Related Art

In today's society, electrical power is being consumed at an increasing rate. As individuals continue to purchase electronic equipment, such as stereos, televisions, DVD players, personal computers, appliances, air conditioners, and other similar devices, the demand for electrical power increases. Further, increased electrical power consumption also results in an increase in the cost of electric utility bills.

Conventional power utility meters represent a type of energy consumption monitoring technology that is frequently used in residential and commercial settings. Such meters are predominantly analog (electromechanical), but digital models have also been developed. Frequently, a single power utility meter, whether analog or digital, services a multifamily dwelling and does not accurately reflect power consumption by individual families or occupants of the dwelling. Inaccuracies in billing can result, as many families split the total utility bill for the dwelling evenly and without regard to actual power consumption by each occupant. In addition to these shortcomings, current electrical power meters do not provide the ability to identify locations in the building where power is most frequently consumed and/or wasted.

Power metering systems using radio frequency ("RF") to remotely measure electrical power consumption have in the past been developed. Such systems, however, require the installation of numerous components at the dwelling. Further, these systems often require the presence of an RF back-haul station or base unit, and do not allow for the direct connection of the meter to the Internet via a wired or wireless network connection. Moreover, there has yet to be developed a wireless power metering system that allows for the transmission of power consumption data, in addition to standard network data, over one or more power lines within a dwelling.

It is likely that recent increases in the price of carbon-based energy sources, such as oil, coal, and natural gas, will result in wider acceptance of alternative energy sources, such as hydrogen. Such alternative energy sources are beginning to appear in hybrid automobiles which rely on battery power and traditional carbon energy sources to power the vehicle. As such, there is need to monitor power consumption not only at fixed locations, such as commercial and residential buildings, but also in mobile applications.

Accordingly, what would be desirable, but has not yet been provided, is a wireless electrical power metering system that allows for the monitoring of electrical power consumption within a dwelling and in mobile applications, while providing both wired and wireless network connectivity.

SUMMARY OF THE INVENTION

The present invention relates to a wireless electrical power metering system. The invention comprises a computer or processor connected to a power line meter, a multichannel power line transceiver, and a wireless interface. The power line meter measures power consumption information, and the processor converts same for transmission as standard Internet Protocol (IP) traffic across a network. The processor can be connected to a household local area network (LAN), a wireless area network, a power line data network, or the Internet. Power consumption information can be measured and transmitted to a wireless monitoring station, one or more computers within the household, or directly to a utility company via the Internet. Appliances located in the dwelling can be selectively controlled by the processor to maximize energy savings.

The present invention also provides network connectivity between a power line network and an existing wired or wireless network within the dwelling. Information transmitted on the wired or wireless network is converted by the processor of the present invention for transmission across the power line. Multiple networks within the dwelling can be inter-networked, and firewall functionality can be provided by the processor. The present invention also includes a filtration device for controlling the flow of data across the power line.

The present invention also provides an electrical power metering system for monitoring power consumption information and providing data communications in multiple dwellings using a single system. A multichannel transceiver module and a power metering module are provided for each power line branch feeding a respective dwelling, and the transceivers and metering modules are connected to a central processing system. The system monitors power consumption information (or other power parameters, such as power quality, frequency, etc.) in each dwelling, and transmits the information to a remote location via data transmission over the Internet or over the power grid. Data communication is provided for each dwelling by a central, wireless interface, as well as through the power lines. Remote sensing capabilities are also provided, wherein the system allows for the remote monitoring of smoke, carbon monoxide, or other parameters in each dwelling, as well as video or motion within the dwelling for security purposes.

The present invention further provides an electrical power metering system having Global Positioning System (GPS), emergency alert reception, biometric scanning, and environmental monitoring capabilities. A GPS receiver allows for the precise location of the electrical power metering system to be determined, stored in memory, and transmitted to a remote location (e.g., to a power utility). An emergency alert receiver allows for the receiption of emergency signals from a central agency (e.g., Emergency Alert System (EAS) signals), and local alerts can be generated within a dwelling. A biometric scanner (e.g., thumbprint or retinal scanner) permits only authorized users to access the electrical power metering system. One or more environmental sensors (e.g., temperature, humidity, etc.) in communication with the electrical power metering system allow for the measurement of local environmental conditions, particularly in harsh or remote environments. The system also allows for monitoring of power consumption in mobile environments, such as in automobiles.

BRIEF DESCRIPTION OF THE DRAWINGS

These and other important objects and features of the invention will be apparent from the following Detailed Description of the Invention, taken in connection with the accompanying drawings, in which.

DETAILED DESCRIPTION OF THE INVENTION

The present invention relates to a wireless electrical power metering system. A computer, connected to a wireless transceiver, a multichannel power line transceiver, and a power meter that measures power consumption data from the power line, converts the measured data to IP format for transmission across a wired or wireless network. The present invention can also remotely control appliances in response to power consumption trends, and provides network connectivity and firewall capabilities between an existing network within a dwelling and a power line network. A wireless monitoring station allows power consumption data to be remotely monitored.

Figure 1:
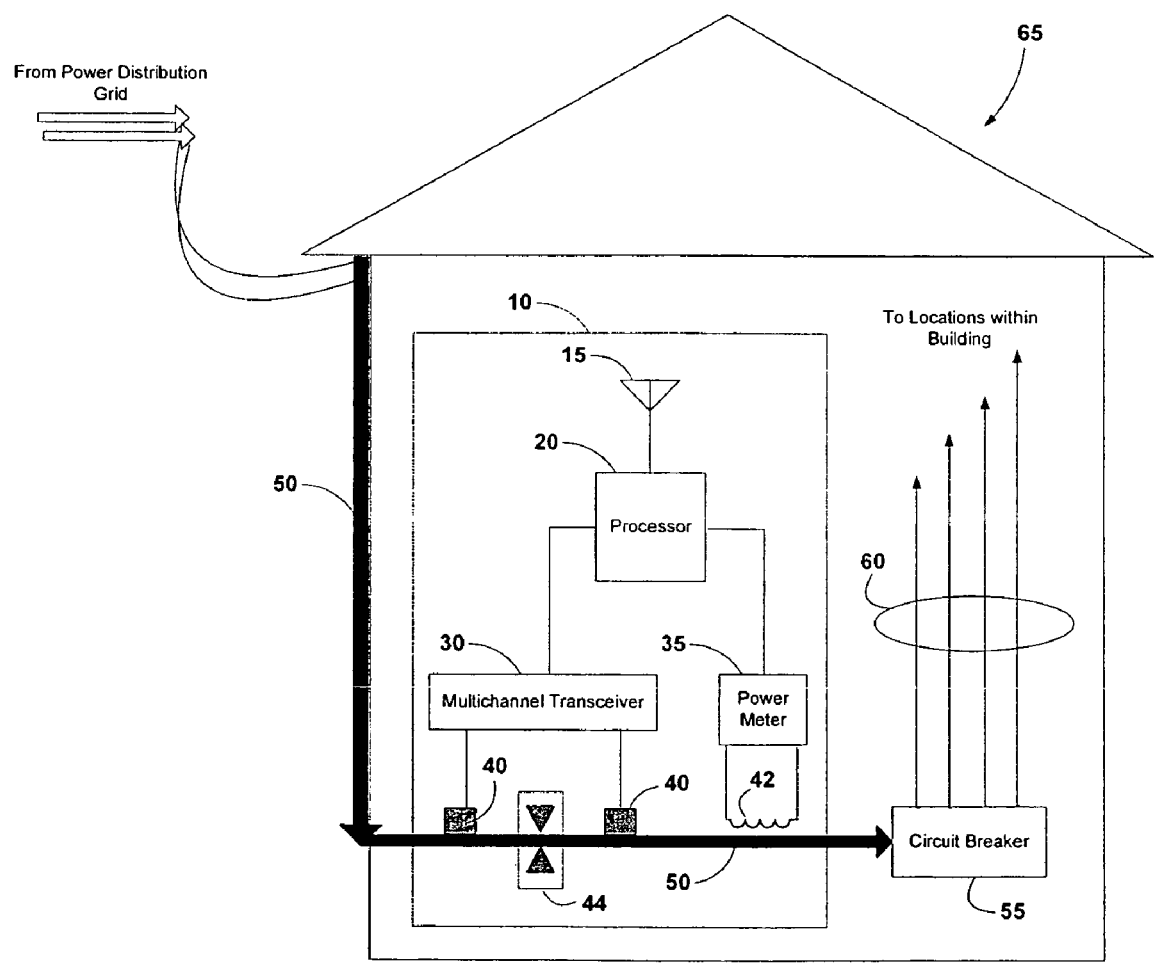
FIG. 1 is a schematic diagram showing the wireless power metering system of the present invention.

FIG. 1 is a schematic diagram showing the wireless power metering system of the present invention, indicated generally at 10 and installed in a dwelling 65. A power line 50 connects the dwelling 65 to the local power distribution grid. The power line 50 can be any power line known in the art, such as a single phase, two-phase, or three-phase power line operating at any acceptable voltage (e.g., 120 or 240 volts). Power line 50 is connected to a conventional circuit breaker 55, and electricity provided therefrom is distributed to various locations within the building via cables 60. In a preferred embodiment of the present invention, the power metering system 10 measures power consumption information on power line 50, before the circuit breaker 55. However, it is to be expressly understood that the power metering system 10 could be placed at any desired location along a power line within a single-family dwelling, multi-family dwelling, commercial business, or elsewhere, to measure power consumption data. For example, the power metering system 10 could be installed on one of the cables 60 to analyze power consumption trends on a given electrical branch stemming from circuit breaker 55. Further, measurement of power consumption in multi-family dwellings can be achieved by positioning a plurality of power metering systems 10 of the present invention at various locations throughout the dwelling (e.g., by placing a single power metering system on each electrical branch that provides electricity for each family within the dwelling).

The power metering system 10 includes an antenna 15, processor 20, multichannel transceiver 30, power meter 35, one or more clamp contacts 40, split-core transformer 42, and clamp filter 44, which operate together to provide data acquisition, power measurement, data conversion, and data transmission services. Clamp filter 44 preferably makes inductive contact with power line 50. Split-core transformer 42 is inductively coupled with power line 50 and senses fluctuations in current flow in power line 50, the fluctuations being indicative of rising and falling power consumption rates within the dwelling 65. Output from the transformer 42 is fed to power meter 35 for processing.

In a preferred embodiment of the present invention, power meter 35 is an ADE7756 active energy metering IC with a serial interface, manufactured by Analog Devices, Inc. The ADE7756 incorporates two second-order, sigma-delta analog-to-digital (A/D) converters, reference circuitry, and associated signal processing circuitry to perform active power measurement from power line 50. Real-time power consumption information, when processed by the ADE7756, is output in the form of a serial data signal capable of being read by any serial device (e.g., an RS-232 data port). Of course, any known power meter capable of producing a serial output signal corresponding to power consumption information can be substituted without departing from the spirit or scope of the present invention. The output from power meter 35 is fed to processor 20 and converted for transmission across a wired or wireless network, as will hereinafter be described in more detail.

The power metering system 10 includes a multichannel transceiver 30 that allows transmission of data, including power consumption, appliance control, and network data, across the power line 50. The multichannel transceiver 30 interfaces with power line 50 via one or more clamp contacts 40, or any other interface such as a direct plug connection into an outlet on the power line 50. Importantly, transceiver 30 allows the processor 20 of power metering system 10 to transmit and receive IP data from power line 50 using known power line protocols such as X-10 or HomePlug. The X-10 protocol allows communication between appliances (e.g., lamps, fans, televisions) in stand-alone networks of 128 or fewer nodes.

The HomePlug protocol allows for the transmission of IP data across power lines at speeds of up to 13.75 Mbits/second, with guaranteed Quality of Service (QoS). The HomePlug protocol interfaces with the Media Access Control (MAC) layer of the software, allowing IP data to be transmitted over power lines. In a preferred embodiment of the present invention, transceiver 30 comprises a VS6801 CMOS chip manufactured by Valence Semiconductor, Inc. The VS6801 chip combines analog-to-digital (A/D) converters, digital-to-analog (D/A) converters, signal conditioning circuitry, and power line interface circuitry to allow transmission of data across power line 50 using Internet Protocol over the HomePlug protocol. Transceiver 30 preferably allows the transmission of data across power line 50 using both the X-10 and HomePlug protocols. Other protocols, of course, are considered within the scope of the present invention.

The power metering system 10 also includes a filter 44 for selectively filtering data transmitted across power line 50. The filter 44 prevents undesired X-10 and IP data extant on power line 50 and originating from a source outside of dwelling 65 from entering the power lines therein. Further, the filter 44 prevents selected X-10 and IP data generated within dwelling 65 from exiting power line 50 and being transmitted across the power distribution grid. Moreover, the filter 44, in conjunction with the processor 20, provides the capability of allowing both internal and external X-10 signals to selectively control appliances within a household. In a preferred embodiment of the present invention, the filter 44 is a clamp filter designed to filter out X-10 frequencies external to the dwelling 65.

Figure 2:
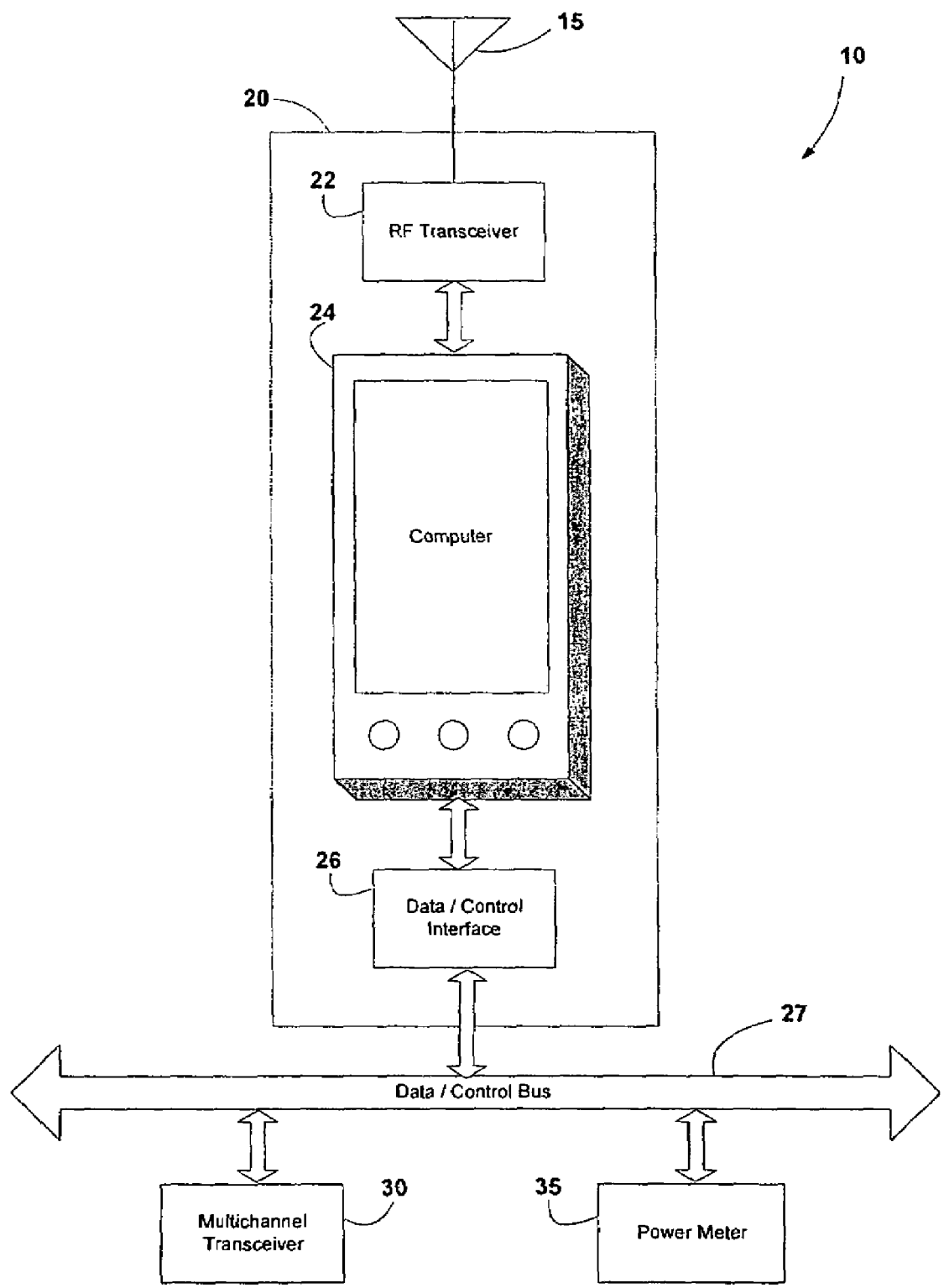
FIG. 2 is a block diagram showing the wireless power metering system of the present invention in greater detail.

FIG. 2 is a block diagram showing the power metering system 10 of the present invention in greater detail. The processor 20 of the present invention comprises an RF transceiver 22 connected to antenna 15, a computer 24, and a data/control interface 26 connected to the computer 24. The RF transceiver 22 receives and transmits data between the computer 24 and a wireless network. Transceiver 22 could be substituted with a wired network interface, such as a 10-Base-T, 100-Base-T, or Gigabit Ethernet interface, without departing from the scope of the present invention. The computer 24 preferably has the processing power and functionality of a personal digital assistant (PDA). Indeed, a PDA, such as the Handspring Visor PDA manufactured by Handspring, Inc., or other similar personal digital devices, including a handheld computer or laptop, could be used. Further, the computer 24 could be an embedded device, and the entire processor 20 could be manufactured as a single, small unit having appropriate input and output ports. The data/control interface 26 connects the computer 24 via data/control bus 27 to both the multichannel transceiver 30 and power meter 35. Preferably, the data/control interface 26 is a parallel interface, but other types of connections, such as an RS-232 serial interface or Universal Serial Bus (USB) connection, could be utilized.

Importantly, the processor 20 of the present invention allows data to be transmitted between a wireless (or wired) network connected to the computer 24 and a power line within a dwelling. This allows conventional wired and wireless networks within a dwelling to be expanded using the power lines within dwelling, or to selectively allow data from the network to be transmitted outside of the dwelling. Further, the processor 20 allows power consumption data to be transmitted across a wired or wireless network, and appliance control signals (e.g., X-10 control signals) to be sent across the power line connected to multichannel transceiver 30. Additionally, the computer 24 contains routing functionality to selectively route and filter information between a wireless or wired network and the power line, or between sub-networks on the power line.

The computer 24 of the present invention may be programmed to convert a variety of different information types into different formats for internal and external transmission across wired, wireless, and power line networks. By the terms "internal" and "internally," it is meant transmission of data signals on a network located within the same building where the computer 24 is located. Conversely, by the term "external" and "externally," it is meant transmission of data signals on a network located outside of the building where the computer 24 is located (e.g., to one or more dwellings located in the same community). The conversion procedures performed by computer 24 include, but are not limited to:

1. Selective conversion of internal or external X-10 control signals for internal or external IP transmission. This procedure allows internal or external X-10 control/data signals to be selectively converted to IP traffic for internal or external transmission on a wired, wireless, or power line (e.g., Home-Plug) network. The resulting IP traffic can be directed to desired IP addresses using standard router and firewall mechanisms 2. Selective conversion of internal or external IP traffic for internal or external X-10 transmission. This procedure allows internal or external IP traffic to be selectively converted into X-10 control signals for internal or external transmission across a power line network. The user is provided with the ability to select IP traffic (e.g., by IP address, IP destination port, type of IP traffic, and content of IP traffic) to be converted, using a standard firewall mechanism. The resulting X-10 control signals can be directed to desired X-10 devices or codes.

3. Selective conversion of internal or external X-10 control signals for internal or external X-10 transmission. This procedure allows internal or external X-10 control/data signals to be converted for transmission on an internal or external X-10 network. The user has the ability to select the X-10 signals to be converted, based upon one or more codes embedded within the signal and using a standard firewall mechanism. Internal or external X-10 control/data signals can be used to control or pass data to internal or external X-10 devices.

4. Selective conversion of power consumption data for internal or external IP transmission. This procedure allows power consumption data acquired by the present invention to be converted to IP format for internal or external transmission on an IP network. This allows power consumption information to be measured within the building (e.g., at one or more computer stations connected to a home LAN or wireless network), proximal to the building (e.g., a handheld, remote monitoring station having a wireless interface), or external to the building (e.g., by a power utility company via the Internet).

Figure 3:
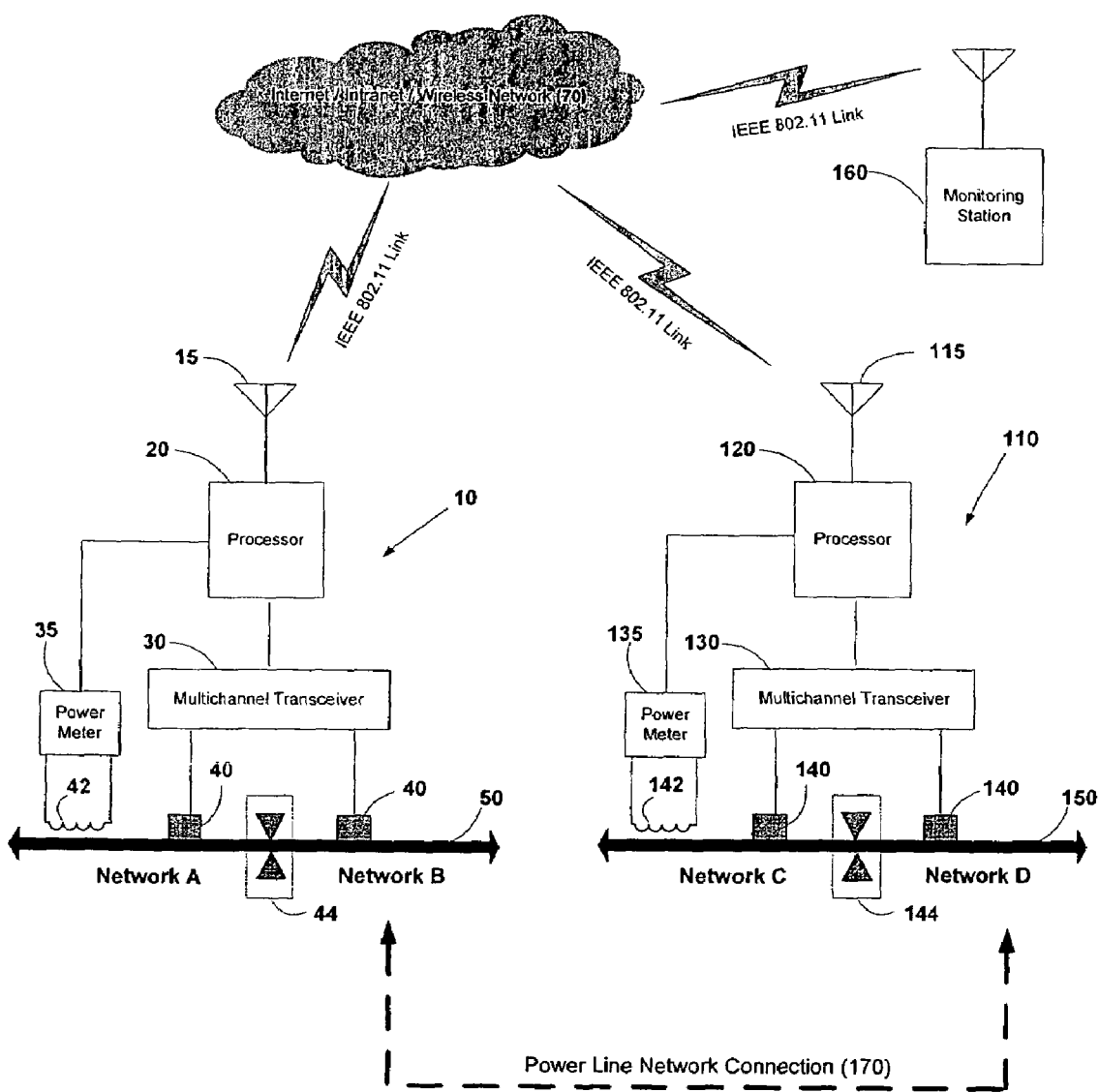
FIG. 3 is a schematic diagram showing communication between two wireless power metering systems according to the present invention and a wireless monitoring station.

FIG. 3 is a schematic showing communication between two wireless power metering systems according to the present invention and a wireless monitoring station. In this arrangement, a first power metering system 10, a second power metering system 110, and a monitoring station 160 communicate using network 70, which may be, for example, a wireless IEEE 802.11 network known in the art. Further, the network 70 can be connected to the Internet, an intranet, or a wired Ethernet connecting the power metering systems 10, 110 and the monitoring station 160.

The first power metering system 10 monitors power consumption on power line 50, which for purposes of illustration, is a power line existing in a first dwelling. The power line 50 has two power line networks A and B, which can be either X-10 sub-networks, IP sub-networks utilizing the HomePlug protocol, or any other type of sub-network. Preferably, power line networks A and B are HomePlug sub-networks that allow for the transmission of IP data thereon. Power consumption data is measured by power meter 35 via transformer 42, and relays same to processor 20. The multichannel transceiver 30 is connected to networks A and B via clamp contacts 40, and allows data to be selectively transmitted and received across networks A and B. The filter 44 prevents stray X-10 signals from network A from interfering with network B, and vice versa. Further, the processor 20, via a wireless interface and antenna 15, can communicate with network 70 to transmit and receive data.

Similarly, the second power metering system 110 monitors power consumption on power line 150, which for purposes of illustration, is a power line existing in a second dwelling. The power line 150 has two power line networks C and D. Preferably, power line networks C and D are HomePlug sub-networks that allow for the transmission of IP data. Power consumption data is measured by power meter 135 via transformer 142, and relays same to processor 120. The multichannel transceiver 130 is connected to networks C and D via clamp contacts 140, and allows data to be selectively transmitted and received across networks C and D. The filter 144 prevents stray X-10 signals from network C from interfering with network D, and vice versa. Further, the processor 120, via a wireless interface and antenna 115, can communicate with network 70 to transmit and receive data.

The monitoring station 160 communicates with network 70 to transmit and receive information between power metering systems 10, 110. The monitoring station 160 could be a stand-alone PC, a handheld PDA with an IEEE 802.11 wireless interface similar to the wireless power meters 10, 110 of the present invention, or any other suitable device. The monitoring station 160 allows for the remote monitoring of power consumption information captured by power meters 10, 110 and transmitted wirelessly to monitoring station 160 via network 70.

The monitoring station 160 could be used by a variety of individuals, including, for example, power utility meter reading personnel or a homeowner. A power utility meter reader could quickly and conveniently monitor power consumption information for a given household by walking near the vicinity of the household, wherein the power consumption information could be transmitted by the wireless power metering system of the present invention to the monitoring station 160. The acquired information could then be logged in the monitoring station 160 for future billing. Further, the monitoring station 160 could be used by a homeowner to monitor power consumption trends within the household and adjust power consumption to minimize utility costs.

Importantly, the power metering systems 10, 110 also allow for the transmission of data, including power consumption data, across the Internet. Thus, power consumption information could be transmitted directly to a power utility by power metering systems 10, 110 for immediate processing and billing, thereby obviating the need for meter reading personnel. Further, appliances within the households connected to the power lines 50, 150 can be selectively activated and de-activated by power metering systems 10, 110 to maximize efficiency, wherein X-10 or other similar control signals are transmitted across power lines 50, 150 and/or networks A-D to control desired appliances within the households.

Moreover, the power metering systems 10, 110 allow for the transmission of non-appliance-related data (e.g., standard IP network traffic) across the power lines 50, 150 and/or networks A-D. For example, IP-based traffic could be selectively transmitted between networks A and B of power line 50 in a first household by power metering system 10. Similarly, traffic could be selectively transmitted between networks C and D of power line 150 in a second household by power metering system 110. A power line network connection 170 could be provided between the two households for allowing the transmission of IP data therebetween, using a standard power line network protocol (e.g., the HomePlug protocol) between the power lines 50, 150. In such an arrangement, both of the power metering systems 10, 110 could be configured to provide firewall services, so that only desired traffic external to each of the households is allowed. Further, both IP-based traffic, including IP-encapsulated power consumption data, can be shared between the power metering systems 10, 110 using network 70.

Figure 4:
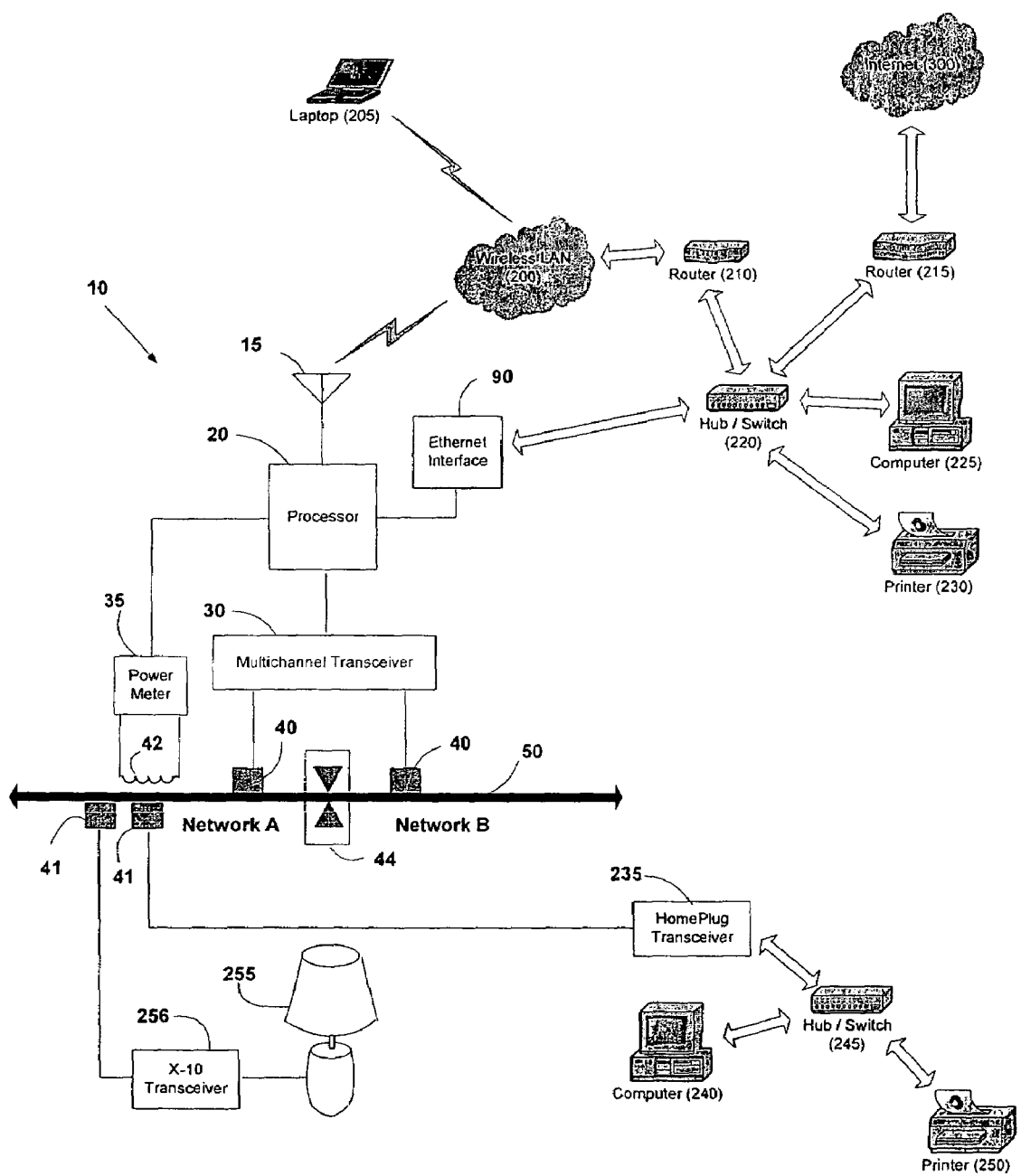
FIG. 4 is a schematic diagram showing the wireless power metering system of the present invention implemented in a household network.

FIG. 4 is a schematic showing the wireless power metering system of the present invention implemented in a household network. As mentioned earlier, the wireless power metering system of the present invention, in addition to providing power consumption measurement, also provides network connectivity for a plurality of devices within a household. Thus, as shown in FIG. 4, a variety of computer devices and peripherals, in addition to an appliance, can be linked using the power metering system 10 of the present invention.

For example, a hub or switch 220 could be set up within a household to link a computer 225 and a printer 230, and to provide connectivity for the household to the Internet 300 via a router 215 (e.g., a cable or DSL modem) connected to the hub/switch 220. Further, a second router 210 could be connected to the hub/switch 220 to provide connectivity to a household wireless LAN 200, so that a laptop 205 having an IEEE 802.11 interface can wirelessly communicate with the computer 225, printer 230, or the Internet 300.

The wireless power metering system 10 of the present invention can be utilized to extend a household network to include additional devices, such as the computer 240, printer 250, and lamp 255, using the power line 50 of the household. The power metering system 10 can communicate with the wireless LAN 200 using an IEEE 802.11 link, or using a wired Ethernet connection between an Ethernet interface 90 and the hub or switch 220. The processor 20 selectively converts IP traffic from wireless LAN 200 or hub/switch 220 for transmission across the power line 50 using power line protocols such as the HomePlug and X-10 protocols, via the multichannel transceiver 30 and clamp contacts 40. Additionally, the processor 20 selectively converts X-10 and HomePlug traffic received from the power line 50 for IP transmission over the wireless LAN 200 or Ethernet interface 90.

The computer 240 and printer 250 are connected to a hub/switch 245, which, in turn, is connected to the power line 50 via a commercially available transceiver 235 and standard wall power outlet 41. The transceiver 235 is similar to a portion of the multichannel transceiver 30, allowing the transmission and reception of data from power line 50 using the HomePlug or other similar protocol. The transceiver 235 could comprise the VS6801 CMOS chip manufactured by Valence Semiconductor, Inc., or other similar chip. In this arrangement, IP-based data can be shared between the computer 240, hub/switch 245, and printer 250 (each of which may be located in a first location of the building (e.g., a den)), and the laptop 205, router 210, hub/switch 220, router 215, computer 225, printer 230, and Internet connection 300 (each of which may be located in a second location of the building (e.g., a basement)).

The lamp 255, or any other appliance within the household and connected to the power line 50 via transceiver 256 and interface 41, can be selectively controlled by X-10 signals generated by the processor 20 or any other X-10 control device connected to power line 50. The transceiver 256 is similar to a portion of the multichannel transceiver 30, allowing transmission and reception of data from power line 50 using the X-10 or other similar protocol. Further, the lamp 225, or any other X-10 equipped appliance connected to the power line 50, can be selectively controlled by signals generated externally or internally to the household, the signals being filtered and routed by the processor 20 in conjunction with the filter 44. Additionally, traffic between networks A and B is filtered by the filter 44. Power consumption information monitored by processor 20 can be accessed within the home by processor 20, laptop 205, computer 225, computer 240, remotely over the Internet 300, by any wireless device in communication with wireless LAN 200, by any wired device connected to hubs/switches 220, 245, or by any device connected to power line networks A or B.

Figure 5:
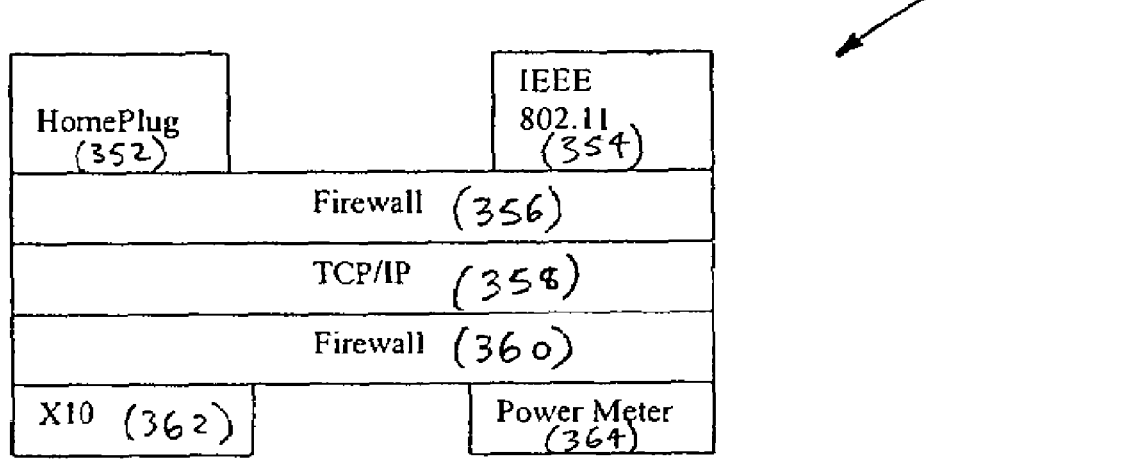
FIG. 5 is a block diagram showing software components of the present invention.

FIG. 5 is a block diagram showing software modules of the present invention, indicated generally at 350. Each of the software modules 350 can be embodied in any digital computer known in the art. In a preferred embodiment of the present invention, software modules 350 reside in non-volatile, random-access memory (RAM), read-only memory (ROM), or other data storage component, such as the computer 24 of the present invention. The core component of the software modules 350 is the Transmision Control Protocol/ Internet Protocol (TCP/IP) stack 358, which allows the wireless power metering system of the present invention to communicate using the Internet Protocol, version 4 (IPv4). It is conceivable that TCP/IP stack 358 could be expanded for use with the IPv6 protocol or other future protocol.

Firewall modules 356, 360 interact with TCP/IP stack 360, and accept data from HomePlug module 352, IEEE 802.11 module 354, X-10 module 362, and power meter module 364. The firewall modules 356, 360 provide routing functionality, and control the flow of IP traffic between the modules 352, 354, 362, and 364. HomePlug module 352 accepts incoming IP-base d HomePlug signals and relays same to firewall 356, in addition to generating outgoing HomePlug signals from IP-based traffic provided by firewall 356. IEEE 802.11 module 354 allows IP-based traffic to be wirelessly transmitted and received by firewall 356. X-10 module 362 converts incoming X-10 signals to IP-based traffic and relays same to firewall 360, in addition to generating outgoing X-10 signals from IP-based traffic provided by firewall 360. Power meter module 364 converts incoming power consumption information measured by power meter 35 of the present invention into IP-based traffic, and routes same to firewall 360.

Figure 6:
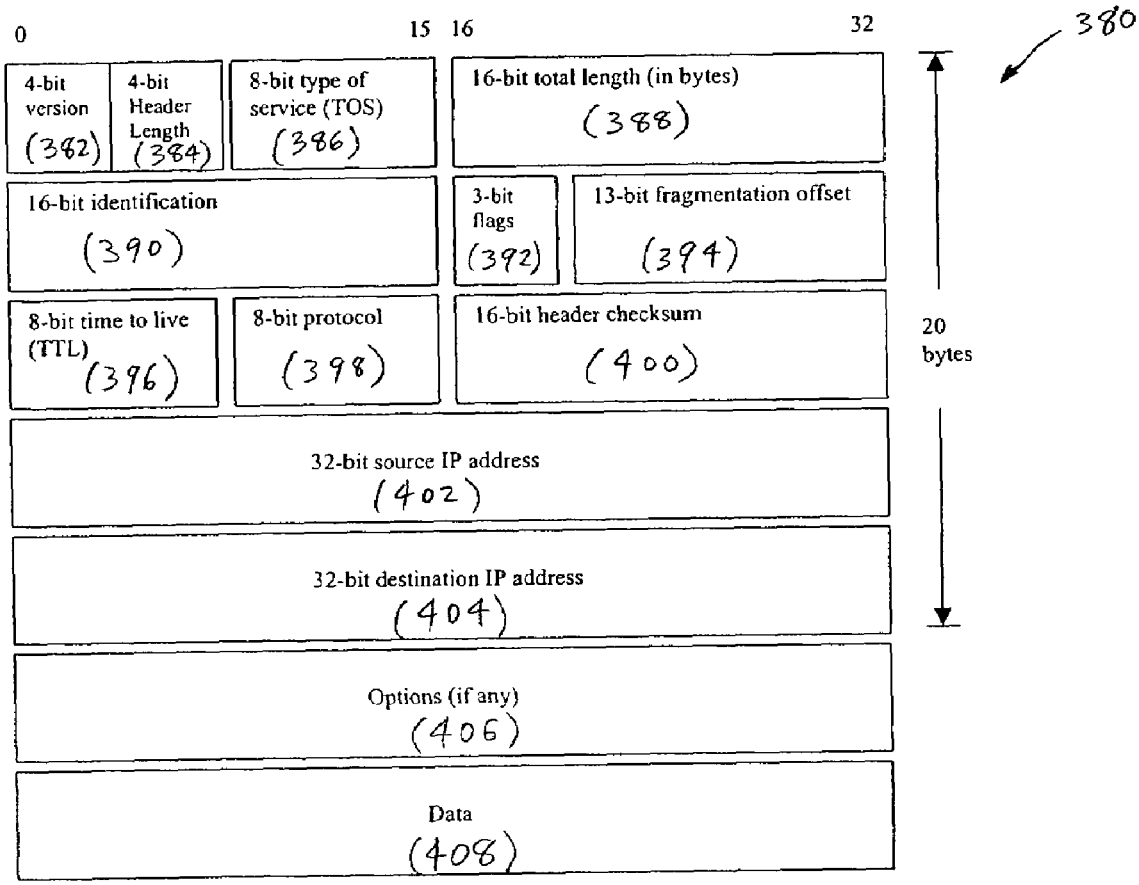
FIG. 6 is a block diagram showing a standard Internet Protocol, Version 4 ("IPv4") packet utilized by the present invention.

FIG. 6 is a block diagram showing a standard Internet Protocol, Version 4 ("IPv4") packet utilized by the present invention and indicated generally at 380. The IPv4 packet 380 comprises a number of sub-components, including version block 382, header length block 384, type-of-service (TOS) block 386, total length block 388, identification block 390, flags block 392, fragmentation offset block 394, time-to-live (TTL) block 396, protocol block 398, header checksum block 400, source IP address block 402, destination IP address block 404, options block 406, and payload data block 408. The present invention stores X-10 control signals and data, and power consumption data in the payload data block 408, thereby encapsulating the data in an IP format and allowing transmission of same across any IP network. For example, the X-10 module 362 of the software modules 350 of FIG. 5 stores X-10 control data in the payload data block 408, thereby converting X-10 data into IP-based data. The power meter module 364 of the software modules 350 of FIG. 5 stores power consumption information in the payload data block 408, thereby converting power consumption information into IP-based data.

Figure 7:
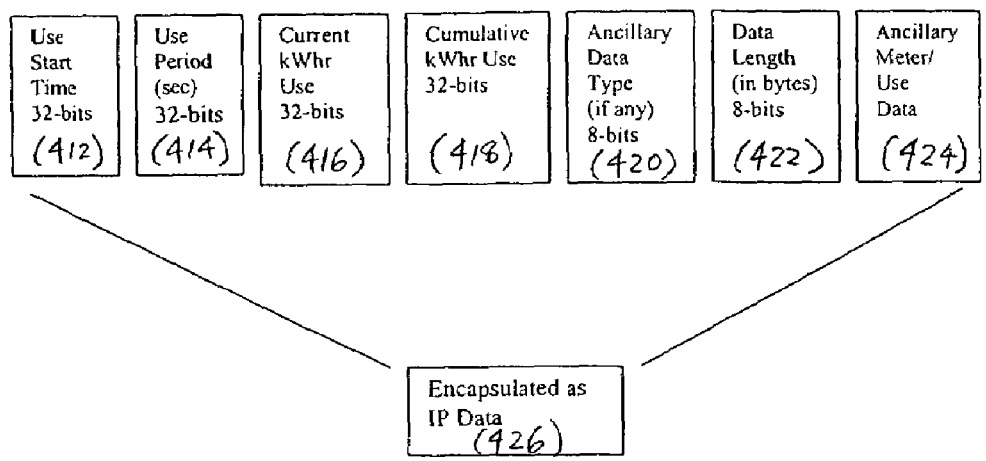
FIG. 7 is a block diagram showing a sample IP packet according to the present invention for transmitting power consumption data.

FIG. 7 is a block diagram showing the data portion of a sample IP packet 410 according to the present invention for transmitting power consumption data. The power consumption data measured by the present invention is stored in a plurality of data blocks 412-424. Block 412 stores the start time of energy consumption for given use period as a 32-bit block. Block 414 stores the use period of energy consumption as a 32-bit block. The kilowatt-hour usage for the current use period is stored as a 32-bit value in block 416. The cumulative kilowatt-hour usage value for all use periods (since setting the meter, or since the last roll-over) is stored as a 32-bit value in block 418. Any ancillary data types (for future expansion or use) are stored as 8-bit values in block 420. The data length of the power consumption message is stored as a 8-bit value in block 422. Finally, any ancillary meter use data is stored in block 424. Each of these components are stored in the payload data block 408 of FIG. 6, resulting in an encapsulated, IP-based power consumption data packet 426 which may be transmitted across any IP-based network.

Figure 8:
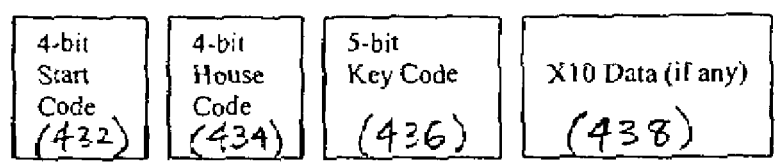
FIG. 8 is a block diagram showing a sample IP packet according to the present invention for transmitting X-10 control data.

FIG. 8 is a block diagram showing the data portion of a sample IP packet 430 according to the present invention for transmitting X-10 control signals or data. As mentioned earlier, X-10 control signals or data are stored by the present invention in the payload data block 408 of FIG. 6, allowing for the transmission of X-10 data as IP-based data. The X-10 control data comprises a 4-bit start code block 422, a 4-bit house code block 434, a 5-bit key code block 436, and X-10 payload data block 438. Each of these blocks are encapsulated to form an IP-based X-10 data packet 440 which may be transmitted across any IP network.

Figure 9:
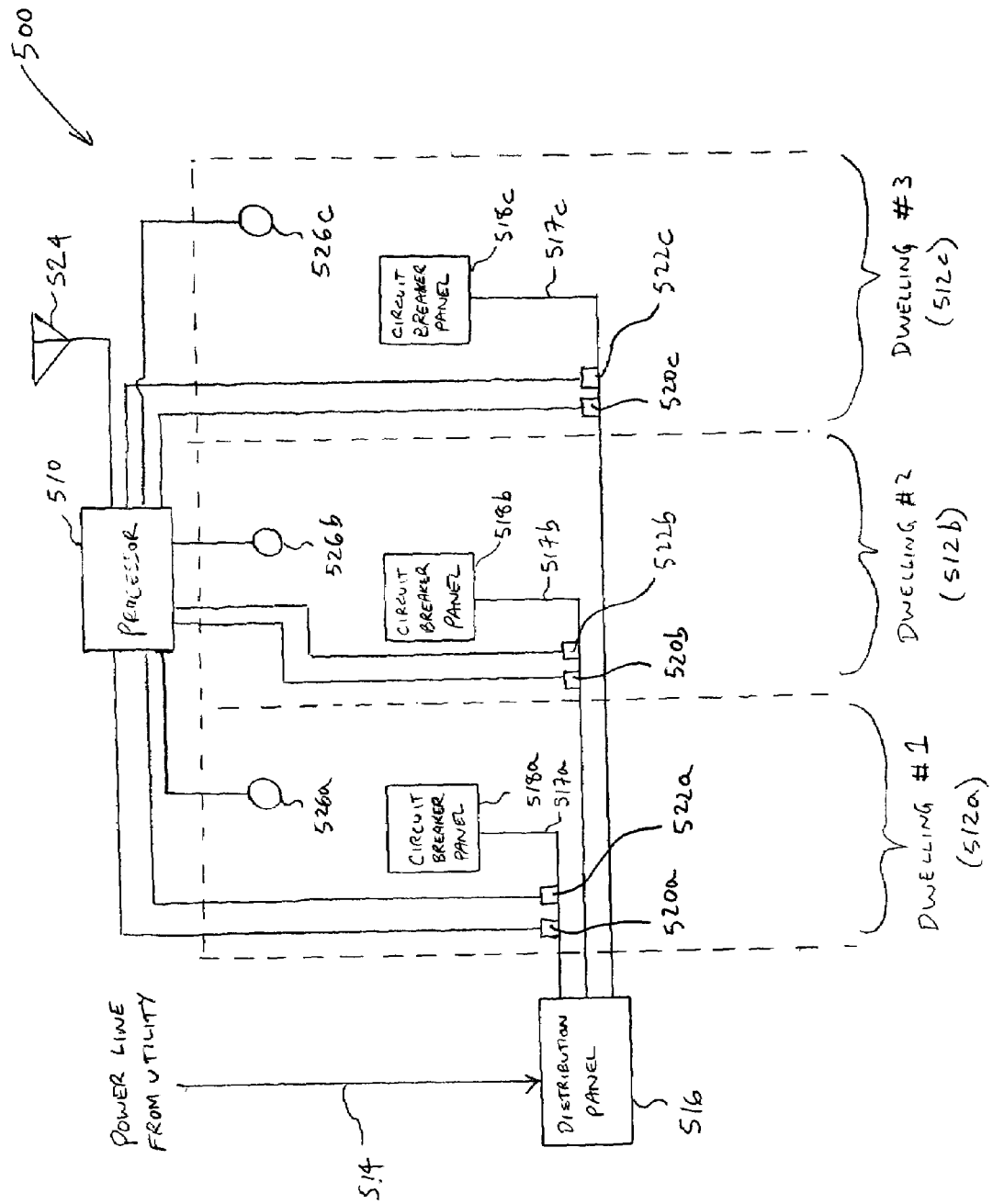
FIG. 9 is a block diagram of another embodiment of the present invention, showing a single electrical power metering system having multiple transceivers and power meters in multiple dwellings.

FIG. 9 is a block diagram showing another embodiment of the electrical power metering system of the present invention, indicated generally at 500, wherein a single processor 510 provides power metering and data communications capabilities for multiple dwellings 512a-512c. The dwellings 512a-512c could include apartments or condominiums in a single building, each of which are serviced by a single power line 514 from a power utility distributed via a central distribution panel 516 and branch circuits 517a-517c to circuit breaker panels 518a-518c in the dwellings 512a-512c. The branch circuits 517a-517c include dedicated power metering modules 520a-520c for monitoring power consumption (and, optionally, power quality) in the respective dwellings 512a-512c, and multichannel transceiver modules 522a-522c for providing internal and external data communications for each of the dwellings 512a-512c using the branch circuits 517a-517c and the common utility power line 514.

Each of the power metering modules 520a-520c could include a split-core transformer and associated power metering electronics, such as the split-core transformer 42 and power meter 35 discussed above with respect to FIG. 1. Further, each of the multichannel transceiver modules 522a-522c could include clamp contacts, filters, and transceiver electronics (e.g., HomePlug, X-10, etc.), such as the clamp contacts 40, filter 44, and multichannel transceiver 30 discussed above with respect to FIG. 1. Each of the power metering modules 520a-520c and the multichannel transceiver modules 522a-522c are in electrical communication with the processor 510. It should be noted that the power metering modules 520a-520c and the transceiver modules 522a-522c need not be positioned in proximity to the circuit breaker panels 518a-518c or within the dwellings 512a-12c. Indeed, these components, in addition to the processor 510, could be positioned proximal to the distribution panel 516 (for instance, in the basement of the building to allow for easy access). Advantageously, the processor 510 allows power consumption to be monitored in multiple dwellings using a central monitoring system. The power consumption information could be transmitted to a power utility using the power line 514 or any other desired communications medium, such as by encapsulation into IP format and transmission over the Internet.

The processor 510 also allows for data communications using the common power line 514 and branch circuits 517a-517c in the manner discussed herein. This allows for communications between each dwelling 512a-512c, as well as outside the dwelling. The processor 510 could also be connected to a wireless interface 524 to allow for wireless communications between occupants of the dwellings 512a-512c. Multiple wireless interfaces could be provided and connected to the processor 510 to allow for extended coverage. It should also be noted that the processor 510 provides X-10 functionality for allowing remote control of appliances in the dwellings 512a-512c. Further, X-10 functionality could be extended by encapsulating X-10 control signals into IP packets (as disclosed herein) for allowing remote control of appliances using the Internet.

The electrical power metering system 510 could also include a plurality of sensors 526a-526c for monitoring environmental and/or safety conditions within the dwellings 512a-512c. The sensors 526a-526c could include smoke detectors, carbon monoxide detectors, or other detectors. The monitored information could then be converted by the processor 510 for transmission to a destination (e.g., to a server connected to the Internet, or a server within the building) to provide for remote monitoring of safety conditions in the dwellings 512a-512c. The sensors 526a-526c could also include security sensors, such as cameras, infrared sensors, etc., such that the processor 510 can provide security monitoring for each of the dwellings 512a-512c. Captured security information (such as video) could be remotely monitored by building security, a security company (via an Internet connection to the processor 510), or by a governmental agency (e.g., the police).

Figure 10:
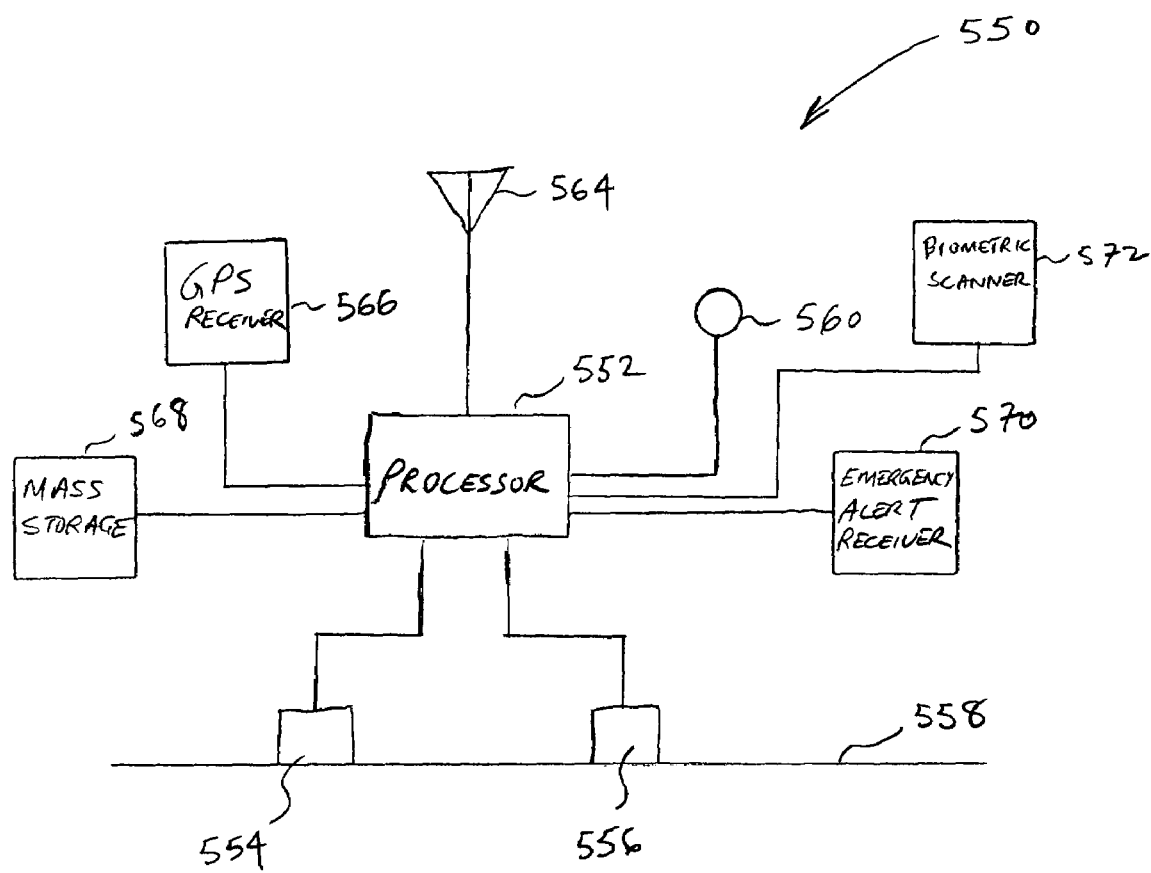
FIG. 10 is a block diagram showing another embodiment of the present invention, wherein the electrical power metering system includes a biometric scanner, Global Positioning System (GPS) and emergency alert receivers, one or more environmental sensors, and a mass storage device.

FIG. 10 is a block diagram showing another embodiment of the electrical power metering system of the present invention, indicated generally at 550. In this embodiment, the electrical power metering system 552 includes a power metering module 554 and a multichannel transceiver module 556 connected to a power line 558, one or more environmental sensors 560, a wireless interface 564, a Global Positioning System (GPS) receiver 566, a mass storage device 568, an emergency alert receiver 570, and a biometric scanner 572. The power metering module 554 and the multichannel transceiver module 556 allow for power metering and data communications using the power line 558, as discussed herein. The power metering module 554 could include a dedicated power meter, such as the power meter 35 and the split-core transformer 42 discussed above with respect to FIG. 1. Further, the multichannel transceiver module 556 could include clamp contacts, a filter, and a multichannel transceiver, such as the contacts 40, the filter 44, and the multichannel transceiver 30 discussed above with respect to FIG. 1.

The one or more environmental sensors 560 allow the processor 552 to monitor any desired environmental and/or safety condition at the installed location of the system 550. The sensor 560 could include, but is not limited to, a smoke detector, carbon monoxide detector, motion sensor, video camera, radiation sensor (e.g., Geiger counter), seismometer, barometer, inertial measurement unit, altimeter, thermometer, humidity sensor, wind speed detector, microphone, oxygen sensor, hydrogen sensor, biological sensor, chemical sensor, or any other desired sensors. Such sensors are useful for measuring environmental conditions where the electrical power metering system 550 is installed in a harsh environment, such as at a nuclear power plant, factory, or a remote station that is not easily accessible. Any desired combination of sensors could be provided and interconnected with the processor 552 (e.g., in a dedicated sensor/detector unit having a plurality of detectors or sensors). Advantageously, such sensors could contribute to the safe residential and mobile use of future energy sources, such as fuel cells which utilize oxygen and hydrogen to generate electrical power.

The GPS receiver 566 allows the precise location of the electrical power metering system 550 to be determined as desired and monitored remotely. GPS coordinates of the system could also be programmed into non-volatile memory. GPS coordinates (whether programmed into the system or produced by the GPS receiver 566) could be periodically transmitted (either wirelessly using the wireless interface 564, or via the power line 558 using the multichannel transceiver 556), such as with each transmission of power consumption data. The GPS coordinates provide information about the precise location of the system 552 in three dimensions. The GPS receiver 566 could also operate in a differential GPS environment, wherein a network of fixed, ground-based reference stations are used to calculate the difference between positions indicated by satellites of the GPS system and known, fixed positions. GPS coordinates can be embedded into IP packets generated by the system 550, and can be used to authenticate transmissions.

It should be noted that the GPS receiver 556 could also include a transmitter and associated antenna for transmitting location information to one or more receivers within range of the system 550. If the system 550 is positioned in a fixed location, the processor 552 can be programmed (seeded) with precise location coordinates. The processor 552 could then receive standard GPS signals using the GPS receiver 556, and could compare the received GPS coordinates to the programmed (seeded) coordinates. Any discrepancies (differential) between the received and programmed coordinates could then be transmitted to one or more receivers within range of the system 550, whereupon the receivers can utilize the differential information to calibrate the receivers' respective coordinate information. Such an application would be especially useful in an urban location, where GPS signals are difficult to receive. Further, where GPS satellite receiption is weak or incomplete, altitude information stored in the processor 552 (where the sensor 560 includes an altimeter, and altitude information is periodically stored in the processor 552) can be utilized to refine location estimates.

The mass storage device 568 allows data generated by the system 550 to be stored for backup or archival purposes. The storage device 568 could use any removable or permanently-mounted non-volatile memory technology commercially available, such as flash memory (e.g., memory cards, sticks, keyfobs), hard disk (e.g., Microdrive), or any other suitable memory. Importantly, the storage device 568 stores data, state information, and operating parameters of the system 550 to prevent loss of such information if power to the system 550 is interrupted or the system 550 is disabled. It should be noted that the system 550 could also include a battery backup that is automatically activated upon loss of power in the power line 558. Preferably, the storage device 568 backs up data in the processor 552 upon loss of power, whereupon battery power is provided while data is continually backed up to the storage device 568. Advantageously, this arrangement provides the system 550 with the ability to continue transmitting information even after a loss of power, as well as additional time to store critical data and perform any required procedures.

The emergency alert receiver 570 comprises any commercially-available receiver capable of decoding an emergency signal sent over the power line 558 and received by the multichannel transceiver 556. One example is the Emergency Alert System (EAS), wherein emergency signals are broadcasted over power lines into dwellings. The receiver 570 could also be configured to receive EAS signals via cable, digital television, or high-definition television (HDTV) transmissions. The EAS signal, once received, is processed by the processor 552 and corresponding local alerts can be transmitted to occupants of a dwelling (or within multiple dwellings) using the wireless interface 564 or the multichannel transceiver 556. Thus, for example, a user of a computer in wireless communication with the system 550 (e.g., via a home WiFi network) could receive an emergency alert signal on the user's computer screen when an EAS signal is received by the emergency alert receiver 570. Further, an audible (e.g., a speaker or a buzzer) or a visual (e.g., a light) indicator could be provided within the dwelling and in communication with the system 550 for providing an audible or visual indication when an EAS signal is received. Additionally, synthesized speech could be provided, wherein a spoken alert is generated in the dwelling when an EAS signal is received. The receiver 570 could also include a dedicated antenna and associated circuitry for receiving EAS signals.

The biometric scanner 572 could include a thumbprint scanner, a retinal scanner, or any other suitable biometric scanner. This device ensures that only authorized individuals are permitted to access the system 550. Three user access levels could be provided. In user access level one, only normal use of the system 550 is permitted. In user access level two, configuration of the system 550 and the ability to control user access level one is provided. In user access level three, the ability to re-program the system 550 is provided, such as to allow firmware upgrades to be applied or any other data to be uploaded, as well as the ability to control user access levels one and two. User access level three could be accessed remotely (e.g., via a wired or wireless network), for automated or semi-automated downloading of new software builds, and/or uploading of selectable stored data.

It should be noted that the present invention could be adapted for use with Internet Protocol, Version 6 (IPv6) traffic. The IPv6 protocol, promulgated by the Internet Engineering Task Force (IETF), provides a 128 bit IP address space to allow for a greater number of nodes than that currently offered by IPv4. IPv6 is backwards-compatible with IPv4 traffic, and provides enhanced features such as Quality of Service (QoS) capabilities, simplification of header formats, and expanded routing and addressing capabilities. Thus, power consumption information generated by the present invention could be encapsulated into IPv6 packets for transmission across the Internet. Further, appliance control commands (e.g., X-10 commands) could also be encapsulated in IPv6 format for transmission across the Internet to allow for remote control of appliances. Further, the electrical power metering system of the present invention could provide routing, gateway, and tunneling capabilities between IPv4 networks (for example, an IPv4 network internal to a dwelling) and IPv6 networks (for example, a remote, IPv6 node on the Internet and external to the dwelling). IPv4 and IPv6 stacks could be provided in the electrical power metering system, such that the system could be assigned permanent IPv4 and/or IPv6 addresses. Support for peer-to-peer protocols, whether in IPv4 or IPv6 format (or both), could also be provided.

The electrical power metering system of the present invention could include support for a variety of protocols and/or applications at numerous layers of the Open Systems Interconnect (OSI) model, including, but not limited to, the Open Shortest Path First (OSPF) routing protocol, Simple Network Mail Protocol (SNMP), Internet Group Management Protocol (IGMP), Internet Control Message Protocol (ICMP), Dynamic Host Configuration Protocol (DHCP), Quality of Service (QoS) assurance protocols, Voice Over Internet Protocol (VoIP) applications, telnet, and Simple Mail Transfer Protocol (SMTP).

Additionally, the electrical power metering system could operate in various wireless environments, including Bluetooth and meshnet wireless networks. For example, the system could communicate with an internal network using a Bluetooth wireless connection, and with an external meshnet wireless network. Other wireless communications media are also possible, such as high-definition television (HDTV), AM and/or FM radio transmissions, shortwave radio transmissions, and satellite transmissions.

The electrical power metering system of the present invention could include power grid monitoring applications that provide the ability to sense and report changes in power supplied to a dwelling by a power utility. Such applications could include the ability to monitor voltage sags and swells, frequency drifts, or other parameters. These parameters could then be transmitted to a desired destination, such as a server having a dedicated IP address (e.g., at a power utility). Such applications provide a power utility with the ability to monitor and manage brownouts and/or blackouts, as well as to assess damage and necessary repairs in the event of a natural and/or man-made disaster. Additionally, the electrical power metering system of the present invention can monitor power generated at a facility (e.g., through the use of solar cells at a dwelling, or some other co-generation power source), so that appropriate credits can be automatically applied to a consumer's account with a power utility. In such circumstances, the system of the present invention would automatically transmit information about excess power at a dwelling to the power utility, in IP format.

The electrical power metering system of the present invention could also be utilized to monitor power in a mobile environment. For example, the system could be used to monitor power consumption in a hybrid car, and programmed to generate warnings when critical thresholds are imminent (e.g., low battery conditions). Such warnings could be transmitted to a central server or station (e.g., via wireless IP transmission), for remote monitoring. GPS location data could also be transmitted, so that a desired vehicle can be quickly located. In such circumstances, another vehicle could be dispatched to the location of the desired vehicle, to allow for mobile recharging and/or energy transfer. The system could be utilized to monitor Direct Current (DC) as well as Alternating Current (AC) power, in both mobile and fixed applications.

The electrical power metering system of the present invention could also be configured ("hardened") to provide resiliency to natural and man-made disasters. This could be accomplished by providing a hardened casing for the electrical power metering system to provide protection for the system components against nuclear, chemical, or biological attacks, as well as environmental conditions (e.g., water, pressure, physical shock, etc.). Further, protection could be provided against transient effects on electronics (TREE), electromagnetic pulses (EMP), blasts, thermal radiation, or other types of damage. Additionally, the electrical power metering system of the present invention could be connected to one or more chemical or biological sensors/detectors. Such sensors could include, but are not limited to, gene, DNA, or RNA chip-based sensors, microarray sensors, and combinatorial chemistry synthesis sensors. The presence of harmful biological or chemical agents could be detected by such sensors, and the electrical power metering system could be programmed to generate a local alarm (e.g., audible tone) and to transmit an alert via an IP transmission to a remote destination via a wired and/or wireless transmission.

Having thus described the invention in detail, it is to be understood that the foregoing description is not intended to limit the spirit and scope thereof. What is desired to be protected by Letters Patent is set forth in the appended claims.

What is claimed is:

1. An electrical power metering system comprising:
a plurality of power meters for measuring power consumption data at a plurality of, locations, each of the power meters connected to a branch power line circuit supplying power to one of the plurality of locations from a common power line, the branch power line circuit forming an internal power line network within one of the plurality of locations;
a processor connected to the plurality of power meters for converting the power consumption data measured by the plurality of power meters into Internet Protocol (IP) power consumption data; and a plurality of transceivers connected to the processor for transmitting and receiving data between the internal power line networks of the plurality of locations and an external power line network connected to the common power line, at least one of the plurality of transceivers transmitting the IP power consumption data to a remote destination over the external power line network.

2. The system of claim 1, further comprising a plurality of sensors in the plurality of locations connected to the processor for monitoring environmental conditions in the plurality of locations.

3. The system of claim 2, wherein the plurality of sensors comprise smoke detectors.

4. The system of claim 2, wherein the plurality of sensors comprise carbon monoxide detectors.

5. The system of claim 2, wherein the plurality of sensors comprise video cameras.

6. The system of claim 2, wherein the plurality of sensors comprise motion detectors.

7. The system of claim 2, wherein the processor encapsulates data generated by the plurality of sensors into IP format and transmits the data to a remote destination.

8. The system of claim 1, wherein the electrical power metering system further comprises a wireless transceiver for allowing wireless communications with one or more computers in one or more of the plurality of locations.

9. The system of claim 8, wherein the wireless transceiver comprises a meshnet transceiver.

10. The system of claim 8, wherein the wireless transceiver comprises a Bluetooth transceiver.

11. The system of claim 1, wherein the processor communicates with a remote computer system using Internet Protocol version 6 (Ipv6).

12. The system of claim 1, wherein the processor measures power quality information and transmits the power quality information to a power utility company.

13. An electrical power metering system comprising:

a power meter for measuring power consumption information at a location, the power meter coupled with a power line at the location and dividing the power line to form an internal network within the location and an external power line network;

a processor connected to the power meter for convening the power consumption information into Internet Protocol (IP) power consumption information, the processor storing power consumption information measured over a period of time for subsequent transmission to a remote destination, the processor allowing data communications between the internal network and the external power line network;

means for transmitting the IP power consumption information to a remote destination over the external power line network; and a sensor connected to the processor for monitoring an environmental condition at a location corresponding to the electrical power metering system.

14. The system of claim 13, wherein the processor converts data generated by the sensor into IP format and transmits the data to a remote destination.

15. The system of claim 13, wherein the sensor comprises one of a smoke detector, a motion detector, a video camera, a radiation sensor, a seismometer, a barometer, an inertial measurement unit, an altimeter, a thermometer, a humidity sensor, a wind speed detector, a microphone, an oxygen sensor, or a hydrogen sensor.

16. The system of claim 13, further comprising a wireless transceiver connected to the processor.

17. The system of claim 16, wherein the wireless transceiver comprises a Bluetooth transceiver.

18. The system of claim 16, wherein the wireless transceiver comprises a meshnet transceiver.

19. The system of claim 13, wherein the processor communicates with a remote computing system using Internet Protocol version 6 (Ipv6).

20. The system of claim 13, further comprising a mass storage device connected to the processor for storing data generated by the processor.

21. The system of claim 20, wherein the mass storage device comprises a removable flash memory.

22. The system of claim 13, wherein the processor measures power quality information and transmits the power quality information to a power utility company.

23. The system of claim 13, further comprising an emergency alert receiver connected to the processor for receiving an emergency alert signal.

24. The system of claim 23, wherein the emergency alert receiver comprises an Emergency Alert System (EAS) signal receiver.

25. The system of claim 24, wherein the emergency alert signal is transmitted over the power line to the EAS signal receiver.

26. The system of claim 24, wherein the processor generates a local alert signal within a dwelling.

27. The system of claim 26, wherein the local alert signal is wirelessly transmitted by the processor to a computer system in wireless communication with the electrical power metering system.

28. The system of claim 26, wherein the local alert signal comprises an audible signal generated by a speaker connected to the electrical power metering system.

29. The system of claim 28, wherein the audible signal comprises synthesized speech.

30. The system of claim 24, wherein the EAS signal receiver comprises a digital television (DTV) receiver.

31. The system of claim 24, wherein the EAS signal receiver comprises a high-definition television (HDTV) receiver.

32. The system of claim 13, farther comprising a Global Positioning System (GPS) receiver connected to the processor for determining (GPS coordinates of the electrical power metering system.

33. The system of claim 32, wherein the processor periodically transmits the GPS coordinates to a remote computer system.

34. The system of claim 32, wherein the GPS receiver further comprises a transmitter for transmitting location information to one or more receivers.

35. The system of claim 34, wherein the processor calculates a difference between a received GPS coordinate and a known coordinate, and transmits the difference using the transmitter.

36. The system of claim 13, further comprising a biometric scanner connected to the processor for controlling access to the electrical power metering system.

37. The system of claim 36, wherein the biometric scanner comprises a thumbprint scanner.

38. The system of claim 36, wherein the biometric scanner comprises a retinal scanner.

39. The system of claim 13, further comprising a housing for protecting the electrical power metering system from damage.

40. The system of claim 39, wherein the housing protects against nuclear, chemical, or biological attacks.

41. The system of claim 13, wherein the power meter measures excess power at a location.

42. The system of claim 41, wherein the processor transmits information about the excess power to a utility company for determining a credit to be applied to an account.

43. The electrical power metering system of claim 1, wherein the plurality of power meters measure direct current (DC) power consumption at a plurality of locations.

44. The electrical power metering system of claim 1, wherein the plurality of power meters measure alternating current (AC) power consumption at the plurality of locations.

45. The electrical power metering system of claim 13, wherein the power meter measures direct current (DC) power consumption at a location.

46. The electrical power metering system of claim 13, wherein the power meter measures alternating current (AC) power consumption at a location.

47. The electrical power metering system of claim 13, wherein the system is installed in a mobile environment for measuring power consumption at the mobile environment.

48. The electrical power metering system of claim 47, wherein the mobile environment comprises a vehicle.

\* \* \* \* \*